US005469263A

United States Patent [19]

Waldo, III et al.

[11] Patent Number: 5,469,263
[45] Date of Patent: Nov. 21, 1995

[54] METHOD FOR ALIGNMENT IN PHOTOLITHOGRAPHIC PROCESSES

[75] Inventors: Whitson G. Waldo, III, Hutto, Tex.; Gong Chen; Franco Cerrina, both of Madison, Wis.

[73] Assignee: Motorola, Inc., Schaumburg, Ill.

[21] Appl. No.: 269,978

[22] Filed: Jul. 1, 1994

[51] Int. Cl.⁶ .................................................. G01B 11/00
[52] U.S. Cl. ............................................ 356/401; 250/548
[58] Field of Search ............................... 356/399, 400, 356/401; 250/548

[56] References Cited

U.S. PATENT DOCUMENTS

| | | | |
|---|---|---|---|
| 3,972,616 | 8/1976 | Minami et al. | 356/237 |
| 4,202,627 | 5/1980 | Suzki et al. | 356/401 |
| 4,640,888 | 2/1987 | Itoh et al. | |
| 4,655,598 | 4/1987 | Murakami et al. | |
| 4,655,600 | 4/1987 | Tanigawa. | |
| 4,824,254 | 4/1989 | Ohtsuka et al. | |
| 4,893,163 | 1/1990 | Rudek. | |
| 4,999,487 | 3/1991 | Maruyama et al. | |
| 5,114,236 | 5/1992 | Matsugu et al. | |
| 5,172,190 | 12/1992 | Kaiser | 356/401 |
| 5,264,310 | 11/1993 | Kawai. | |
| 5,285,258 | 2/1994 | Kamon. | |

Primary Examiner—F. L. Evans
Assistant Examiner—Robert Kim
Attorney, Agent, or Firm—Joe E. Barbee

[57] ABSTRACT

A method for alignment in photolithographic processes includes providing a target (31) comprising features having a characteristic spatial period (P). An optical image of the target is captured, and components (33) of the image lacking the characteristic spatial period (P) are filtered out. The filtered image is integrated in the direction of the characteristic period (P) thereby creating an alignment signal (40). The alignment signal (40) is a symmetric signal which correlates to the symmetric target (31). A linear centroid (41) of the alignment signal is located, and corresponds to the precise linear center of the target (31). Consequently, the linear location of an object (10) upon which the target (31) is printed, can be accurately located. The process is performed in two perpendicular dimensions (x,y) so that the object (10) can be precisely located and positioned in two dimensions (x,y).

17 Claims, 4 Drawing Sheets

METHOD FOR ALIGNMENT IN PHOTOLITHOGRAPHIC PROCESSES

FIELD OF THE INVENTION

The present invention relates, in general, to alignment methods, and more particularly, to alignment methods for use in photolithographic processes.

BACKGROUND OF THE INVENTION

Highly precise alignment is required in the photolithographic processes utilized in semiconductor device manufacturing. For example, fabricating semiconductor devices typically requires a series of photolithographic masks used in sequence to create patterns on a semiconductor substrate. Each mask must be positioned precisely with respect to the semiconductor substrate and with respect to the location of the previously used masks.

A variety of methods have been employed in the past in order to precisely locate photolithographic masks and semiconductor substrates. For example, diffraction gratings have been formed in the substrate. The grating is scanned by a light beam and the position of the substrate is detected based on the diffraction of the light. Alternatively, an optically detectable "target" is patterned on the substrate or mask, the target's position being precisely known with respect to the rest of the substrate or mask. An image of the target is captured and the center or edges of the image is located, thereby revealing the position of the substrate or mask. However, such conventional methods are extremely sensitive to anomalies on the surface of the object being positioned. For example, asymmetric photoresist coatings or grains of processing coatings such as metal grains will negatively impact both the diffraction grating alignment method and the conventional optical target location method. For example, with respect to diffraction grating methods, such anomalies will scatter light in an unpredictable way. With respect to the conventional optical target imaging methods, such anomalies will form part of the image, making the image asymmetric. Consequently, the "center" of the image will be offset in an unpredictable way.

What is needed is a method for alignment in photolithographic processing which is robust and insensitive to anomalies on the surface of the object to be positioned.

DETAILED DESCRIPTION OF THE DRAWINGS

The present invention relates to a photolithographic alignment system which uses an optical image of a target patterned on the object to be aligned (i.e. substrate or mask) in order to locate and position the object. For the sake of clarity, and in order to best teach the invention, only the alignment target will be referred to throughout the discussion, and it will be understood that the alignment target is associated with whatever object it is patterned on which is to be located and positioned.

Generally, the system in accordance with the present invention employs a target patterned on an object to be positioned. The position of the target is known very precisely, with respect to the remainder of the object to be positioned. The system very precisely locates the target by capturing an optical image of the target and accurately locating the center of the target. Once the position of the center of the target is known, the object to be positioned may be repositioned in order to bring it into alignment as necessary.

More specifically, a method consistent with the present invention includes providing a symmetric target patterned on an object to be accurately positioned. The target comprises features having a characteristic spatial period. An optical image of the target is captured, and components of the image lacking the characteristic spatial period are filtered out. The filtered image is integrated in the direction of the characteristic period, thereby creating an alignment signal. The alignment signal is a symmetric signal which correlates to the symmetric target. A linear centroid of the alignment signal is located, and corresponds to the precise linear center of the target. Consequently, the linear location of the object upon which the target is patterned can be accurately located. The process is typically performed in two perpendicular dimensions so that the object can be precisely located and positioned in two dimensions.

Figure 1:
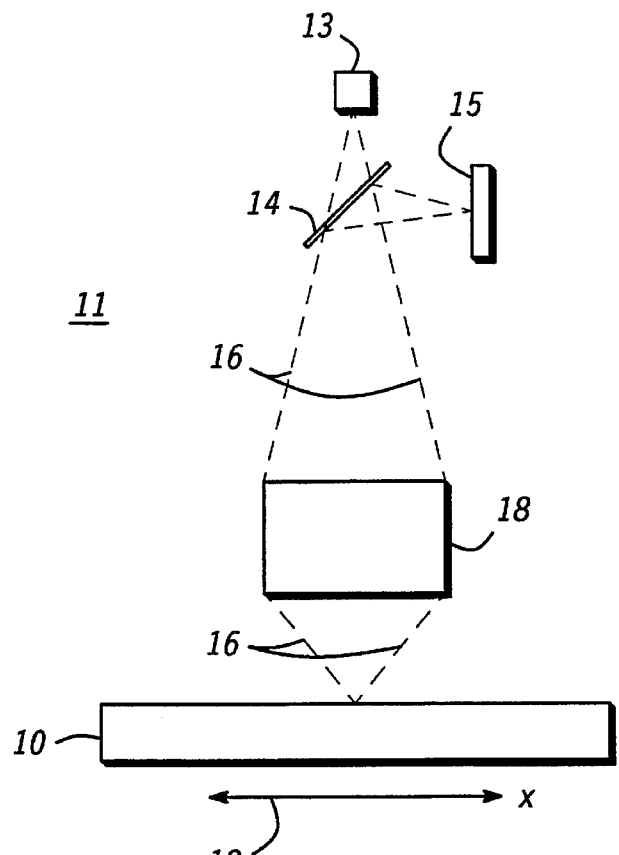
FIG. 1 is a side view representing an optical microscope photolithographic alignment system.

Turning to the figures for more detailed understanding, FIG. 1 is a side view representing an optical photolithographic alignment system. An object to be located and positioned 10 lies beneath optics elements 11. Under typical circumstances, the object 10 may comprise a semiconductor substrate which is being processed in order to yield a plurality of semiconductor devices in the form of semiconductor die. Alternatively, object 10 may be a photolithographic mask which must be precisely located and positioned in order to accurately pattern a semiconductor substrate during device processing. In the embodiment shown, object 10 may be moved back and forth along the x direction indicated by arrow 12. The movement of object 10 will typically be accomplished with a movable stage.

Above object 10 are optical components 11. The optical components 11 of the system include a light source 13, a beam splitter 14, an imaging device such as a charge coupled device 15 and microscope objective 18. Lines 16 represent the light path. It will be recognized by those skilled in the art that microscope objective 18 permits imaging device 15 to obtain an image of a very small target which is printed on object 10. For example, in the case where object 10 is the semiconductor substrate comprising a plurality of semiconductor die in the process of fabrication, optics 11 may be part of a stepper system and each die may have a very small target printed on it. Optics 11 allows the system to capture the image of each target on each die as the stepper moves from one die to another during processing.

Figure 2:
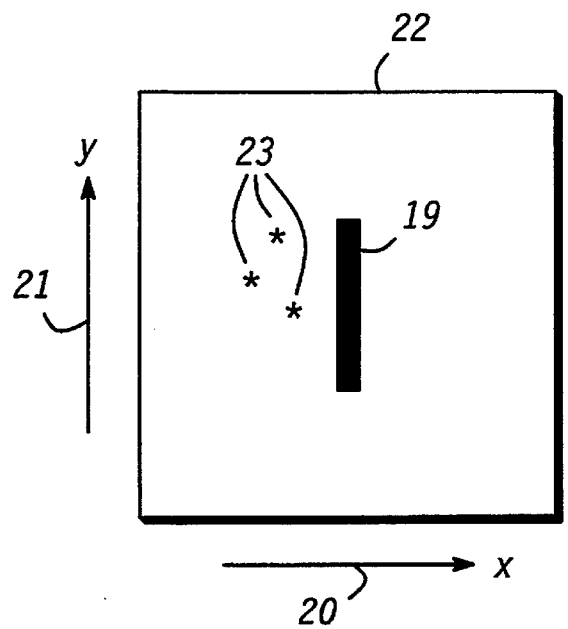
FIG. 2 is a top view representing a prior art alignment target.

Turning to FIG. 2 for a simplified representation of prior art methods, FIG. 2 is a top view representing the field of view 22 of the optics of FIG. 1 which includes target 19. In the embodiment shown, target 19 is an opaque vertical stripe (vertical in the y direction, as indicated) printed on object 10 (FIG. 1). In typical applications, it is necessary to locate the exact center of target 19 along the y direction, indicated by x arrow 20. Note, that a similar target may be used, perpendicular to target 19, for locating the target and therefore object 10 along the y direction, indicated by y arrow 21. Within the field of view 22 of system optics 11, are found optical anomalies represented by *'s 23. Anomalies 23 may, for example, be metal grains which are an artifact of previous process steps.

Figure 3:
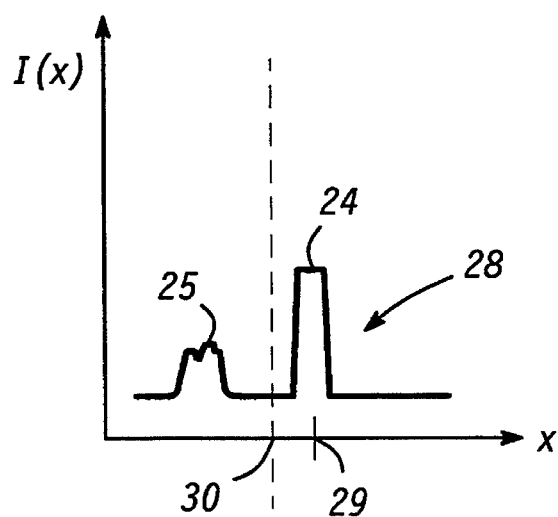
FIG. 3 is a graph illustrating a prior art alignment signal generated from the target of FIG. 2.

Conventionally, in order to locate the exact center of target 19, and therefore object 10 (FIG. 1), an optical image of field of view 22 is obtained. Subsequently, the light "intensity" of the image is integrated in the y direction to provide an "alignment signal". FIG. 3 illustrates the alignment signal 28 resulting from the image captured from field of view 22 according to conventional methods. The alignment signal is derived in a method consistent with the following equation (1):

$$I(x) = \left| \sum_{i=1}^{N} I(x, y_i) \right| \quad (1)$$

That is, the alignment signal, I(x), is the summation (or integration) along the y direction of the intensity of the pixels of the image, yielding an intensity verse x-position alignment signal. It will be understood by those skilled in the art that a variety of analog and digital systems, including a common digital computer, can be coupled to the imaging device 13 in order to capture the image electronically. It is well known that such systems can manipulate the image data in a manner described by mathematical equations, such as equation (1), in order to provide various resultant signals, such as the alignment signals discussed below.

In view of the equation, it will be understood that peak 24 relates to target 19. Furthermore, peak 25 relates to metal grains 23. According to conventional methods, the system attempts to find the exact center of target 19 and therefore the precise location of object 10 by locating the "centroid" along the x direction of alignment signal 28. It will be understood by those skilled in the art that a centroid along x is the position at which equal areas under the curve lie both to the left and the right. Consequently, it will be recognized that for perfectly symmetric image (target) the centroid will lie at the exact center of the target. Therefore, locating the centroid inherently identifies the center of the target. However, if the image is not symmetric as when metal grains 23 are present, the centroid will be shifted from the exact center of the desired target. This concept is illustrated by the separation between location 29 on the x axis of FIG. 3 from dotted line 30 which is the centroid along x of curve 28. FIG. 2 and 3, then, illustrate the fact that the conventional alignment method shown is sensitive to optical anomalies, and negatively impacted by them.

Figure 4:
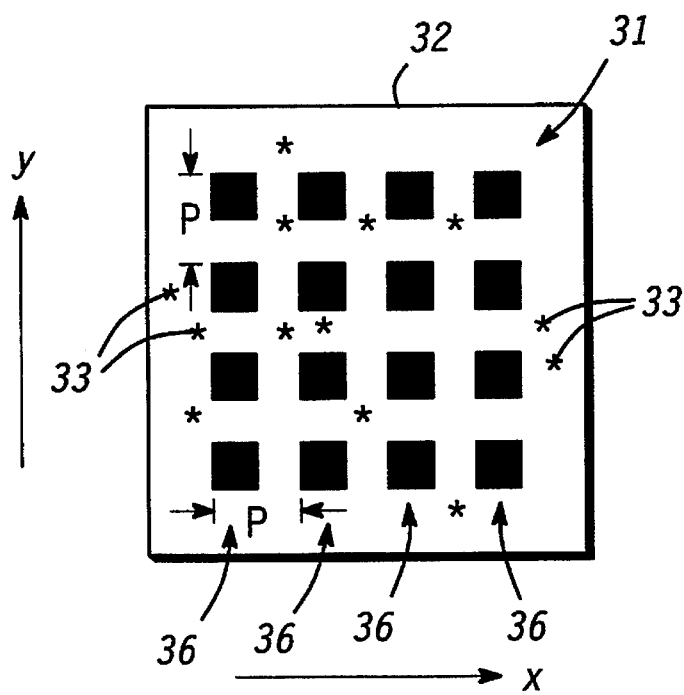
FIG. 4 is a top view representing an alignment target in accordance with the present invention.

Turning to FIG. 4, a target consistent with the method of the present invention is shown. More specifically, FIG. 4 comprises field of view 32 which includes target 31. Target 31 comprises a two-dimensional grid having features spaced in both directions with the characteristic spatial period P. Furthermore, within field 32 is a number of optical anomalies represented by *'s 33, which may be metal grains or the like.

Figure 5:
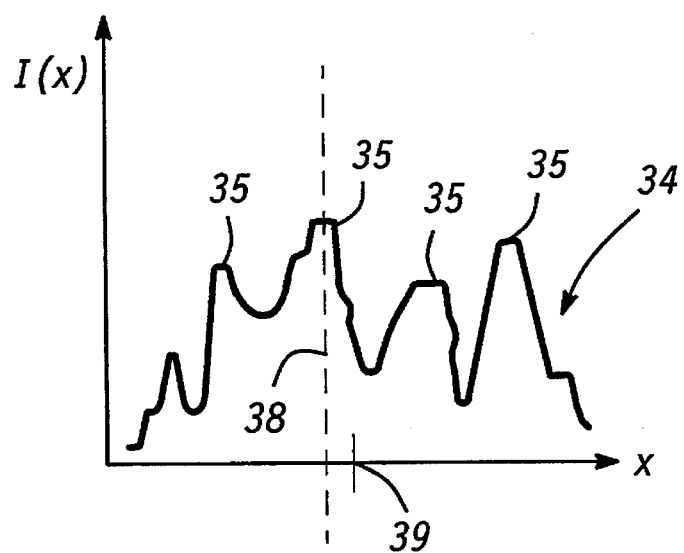
FIG. 5 is a graph illustrating an alignment signal generated from the alignment target of FIG. 4.

Turning to FIG. 5, FIG. 5 illustrates an alignment signal derived from an image obtained from the field of view 32 using the previously discussed conventional method. Alignment signal 34 of FIG. 5 does have certain characteristics which correspond to target 31, but it is highly distorted due to metal grains 33. More specifically, peaks 35 may correspond to columns 36 of the "dots" of target 31. However, because alignment signal 34 is derived in a manner consistent with equation (1) above, grains 33 also effect the shape of the signal. Therefore, alignment signal 34 is highly distorted from the desired signal which would be clean peaks relating to columns 36 of FIG. 4, and nothing more. Proceeding with the conventional method for locating the center of the target along the direction x, the centroid along x of the curve (alignment signal) 34 is located at dotted line 38. However, the actual center of the target is located along the x axis at 39. The separation between centroid 38 and desired location 39 is due to the abundance of particles 33 on the left side of target 31.

Figure 6:
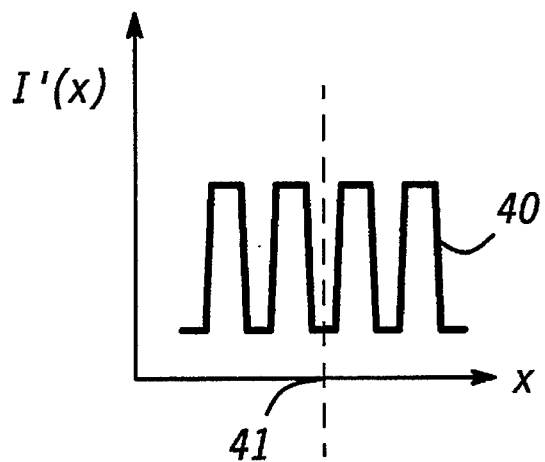
FIG. 6 is a graph illustrating an alignment signal generated from the alignment target of FIG. 4.

Turning to FIG. 6, FIG. 6 illustrates an alignment signal which is derived in accordance with the method of the present invention. More specifically, the alignment signal 40 of FIG. 6 is derived in a manner consistent with the following equation (2):

$$I'(x) = \left| \sum_{i=1}^{N} I(x, y_i) e^{-j2\pi y_i/P} \right| \quad (2)$$

The above equation is one way of mathematically filtering out components of the image derived from field of view 32 which lack the characteristic spatial period P, in the y direction. It will be recognized that anomalies such as grains 33 are typically distributed randomly. Consequently, such anomalies will tend not to exhibit a characteristic spatial period. Therefore, they will tend to be eliminated when components lacking any defined spatial period are filtered from the image data. It should be understood that there are a variety of different ways to filter out components of an image which lack a particular spatial frequency or period, and such alternatives should be understood to fall within the scope of the present invention.

Once a "clean" alignment signal 40 is obtained in accordance with the method of the present invention, the centroid along x 41 of the curve 40 is located, and perfectly coincides with the precise center of the target. This is because the clean alignment signal 40 is not distorted and therefore carries only the features of target 41, which are symmetric by design.

Returning briefly to FIG. 4, it will be recognized that since target 31 is a symmetric two-dimensional grid, target 31 may be employed in a manner similar to that described above to precisely locate the target in the y direction as well.

Figure 8:
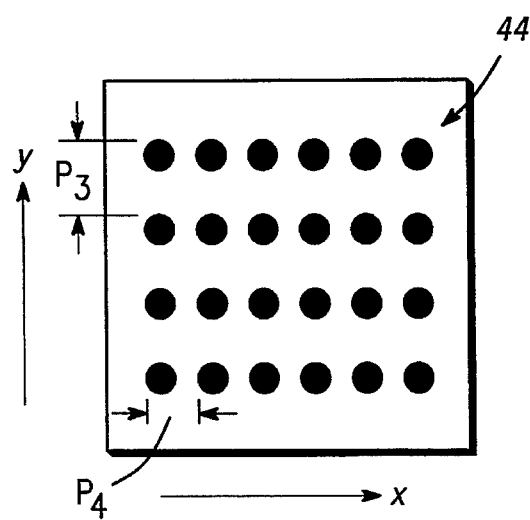
FIG. 8 is a top view representing an alternate alignment target.
Figure 7:
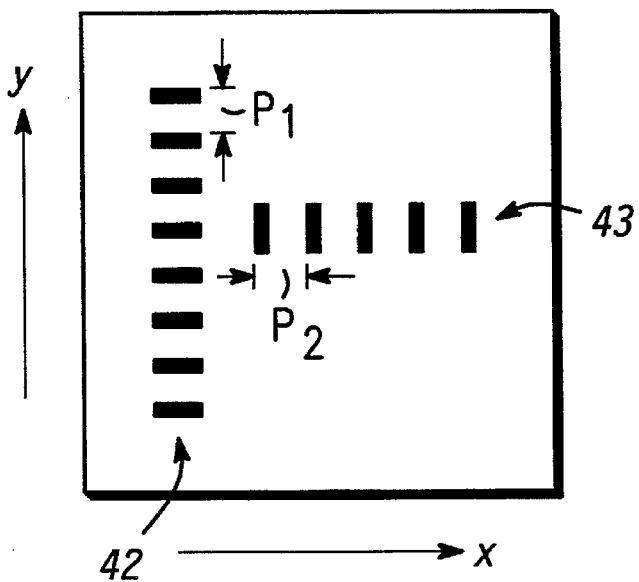
FIG. 7 is a top view representing an alternate alignment target.

FIG. 7 and 8 are alternative targets which may also be employed in accordance with the method of the present invention. More specifically, FIG. 7 illustrates a vertical column 42 of stripes spaced at characteristic spatial period $P_1$. It will be recognized, in view of the foregoing discussion, that vertical column 42 may be used to precisely locate the target in the x direction by summing (integrating) intensity in the y direction while filtering out components lacking characteristic spatial period, $P_1$. Additionally, the target of FIG. 7 includes a row 43 of stripes spaced at a different characteristic spatial period $P_2$. It will be recognized that row 43 may be used to precisely locate the target in the y direction by summing (integrating) intensity in the x direction while filtering out components lacking characteristic spatial period, $P_2$.

Referring to FIG. 8, FIG. 8 illustrates alternative target 44, comprising a two-dimensional grid of rows and columns of circular dots. The dots are spaced in the y direction with a characteristic spatial period, $P_3$, and in the x direction with a characteristic spatial period, $P_4$. Consequently, the image data may be summed in the y direction, filtering out components which lack the characteristic period $P_3$, to provide a "clean" alignment signal expressing intensity verse x position. Similarly, the image data may be summed in the x direction, filtering out components which lack the characteristic period $P_4$, to provide a "clean" alignment signal expressing intensity versus y position.

It should now be appreciated that an improved method for alignment in photolithographic processing has been shown which is capable of accurately locating an alignment target, and accurately positioning an object on which the target is printed. The method disclosed is particularly robust and insensitive to anomalies on the surface of the object to be positioned.

While specific illustrative embodiments of the method of the present invention have been shown, further modifications and improvements will occur to those skilled in the art. Consequently, it should be understood that this invention is not limited to the particular embodiment shown, but rather intended to cover all modifications which lie within the scope of the following claims.

We claim:

1. A method for alignment in photolithographic processes comprising the steps of:

providing a photolithographic alignment target comprising features spaced at a characteristic spatial period;

illuminating the photolithographic alignment target;

obtaining an image of the target;

mathematically filtering out components of the image which lack the characteristic spatial period;

integrating the image in a first direction thereby creating an alignment signal I' (x);

determining, in response to the alignment signal, a linear position of the target in a second direction; and repositioning the target in response to determining the linear position of the target.

2. The method of claim 1, wherein the target comprises a two-dimensional grid of the features spaced in both the first direction and the second direction by the characteristic spatial period.

3. The method of claim 1, wherein the target comprises a two-dimensional grid of the features spaced in the first direction by the characteristic spatial period and spaced in the second direction by a different spatial period.

4. The method of claim 1, wherein the target is patterned on a semiconductor substrate.

5. The method of claim 1, wherein the target is patterned on a photolithographic mask.

6. The method of claim 1, wherein the alignment signal, I' (x), is derived by applying an equation:

$$I'(x) = \left| \sum_{i=1}^{N} I(x,y_i) e^{-j2\pi y_i/P} \right|$$

where P is the characteristic spatial period.

7. The method of claim 1, wherein the step of determining comprises locating a centroid along the second direction of a curve representing the alignment signal.

8. A method for alignment in photolithographic processes comprising the steps of:

providing a two-dimensional target comprising features having a first spatial period in a first direction;

obtaining an image of the target;

mathematically filtering out components of the image that lack the first spatial period in the first direction, thereby creating a filtered image;

summing the filtered image in the first direction, thereby creating an alignment signal;

determining a location of the target along a second direction, perpendicular to the first direction.

9. The method of claim 8, wherein the target comprises a grid of features having the first spatial period in the first direction and a second spatial period in the second direction.

10. The method of claim 8, wherein the target comprises a grid of features having the first spatial period in both the first direction and the second direction.

11. The method of claim 8, wherein the target is patterned on a semiconductor wafer.

12. The method of claim 8, wherein the target is patterned on a photolithographic mask.

13. The method of claim 8, further comprising repositioning the target in response to determining the location of the target.

14. The method of claim 8, wherein the step of determining comprises locating a centroid along the second direction of a curve representing the alignment signal.

15. A method for alignment in photolithographic processes comprising the steps of:

providing an alignment target comprising a plurality of features spaced periodically in a y direction with a characteristic period P;

illuminating the target;

capturing an image of the target;

filtering out components of the image which lack the characteristic period P in the y direction, and summing the image in the y direction by applying the equation:

$$I'(x) = \left| \sum_{i=1}^{N} I(x,y_i) e^{-j2\pi y_i/P} \right|$$

thereby creating an alignment signal represented by a function I' (x);

determining a linear position of the target in an x direction by locating a centroid along x of the function I' (x); and repositioning the target in response to determining the linear position of the target.

16. The method of claim 15, wherein the target comprises a two-dimensional grid wherein the plurality of features are spaced in the y direction with the characteristic period P and spaced in the x direction with a different period.

17. The method of claim 15, wherein the target comprises a two-dimensional grid wherein the plurality of features are spaced in both the x direction and the y direction with the characteristic period P.

* * * * *